(12) United States Patent
Ostertun

(10) Patent No.: US 8,102,725 B2
(45) Date of Patent: Jan. 24, 2012

(54) METHOD FOR CONTROLLING A PRE-CHARGE PROCESS AND A RESPECTIVE INTEGRATED CIRCUIT

(75) Inventor: Soenke Ostertun, Wedel (DE)

(73) Assignee: NXP B.V., Eindhoven (NL)

( * ) Notice: Subject to any disclaimer, the term of this patent is extended or adjusted under 35 U.S.C. 154(b) by 61 days.

(21) Appl. No.: 12/677,287

(22) PCT Filed: Aug. 20, 2008

(86) PCT No.: PCT/IB2008/053332
§ 371 (c)(1),
(2), (4) Date: Mar. 9, 2010

(87) PCT Pub. No.: WO2009/034491
PCT Pub. Date: Mar. 19, 2009

(65) Prior Publication Data
US 2010/0207647 A1  Aug. 19, 2010

(30) Foreign Application Priority Data

Sep. 10, 2007  (EP) .................................. 07116001

(51) Int. Cl.
*G11C 7/00* (2006.01)

(52) U.S. Cl. ...................................................... 365/203

(58) Field of Classification Search .................. 365/203, 365/149
See application file for complete search history.

(56) References Cited

U.S. PATENT DOCUMENTS

| 4,134,056 | A  |   | 1/1979  | Fukui et al.              |
|-----------|----|---|---------|---------------------------|
| 5,296,766 | A  | * | 3/1994  | Masaki ............ 327/387 |
| 6,137,730 | A  | * | 10/2000 | Chien ......... 365/189.02 |
| 2005/0036383 | A1 |   | 2/2005 | Gamperl et al.            |
| 2006/0233019 | A1 | * | 10/2006 | Kostylev et al. ...... 365/163 |
| 2007/0171099 | A1 |   | 7/2007 | Kuenemund                 |
| 2009/0116281 | A1 | * | 5/2009 | Parkinson et al. ..... 365/163 |
| 2009/0213673 | A1 | * | 8/2009 | Flautner et al. ....... 365/203 |
| 2010/0309735 | A1 | * | 12/2010 | Hayashi ........... 365/189.09 |

FOREIGN PATENT DOCUMENTS

WO  2004/047172 A1  6/2004

OTHER PUBLICATIONS

Alioto, M., et al; "Techniques to Enhance the Resistance of Precharged Busses to Differential Power Analysis"; 16th Intl Workshop on Power and Timing Modelling, Optimization and Simulation; PATMOS 2006, Montpellier, France; 10 Pages.

* cited by examiner

*Primary Examiner* — Tuan T. Nguyen

(57) ABSTRACT

A method of controlling a pre-charge process of a data line (21, 22) in an integrated circuit (100) comprises the step of monitoring a rate of change of a voltage applied to the data line (21, 22) for enhancing the security. Further a respective integrated circuit (100) is disclosed.

10 Claims, 1 Drawing Sheet

METHOD FOR CONTROLLING A PRE-CHARGE PROCESS AND A RESPECTIVE INTEGRATED CIRCUIT

FIELD OF THE INVENTION

This invention relates to a method for controlling a pre-charge process of a data line in an integrated circuit and a respective integrated circuit.

BACKGROUND OF THE INVENTION

So called smartcard chips are carrying important information and/or data with which an authorization or identification of a user may be performed. With such cards an access to a place or service can be enabled as well as the administration of a bank account. The stored information must not be accessible from the outside to prevent an abuse. Especially the key data for encoding information to be transmitted have to be protected.

For an attack on the security it is known to use parameters like temperature, supply voltage, clock rate or a voltage peak and the radiation with light. By such attacks it is a goal to modify a content of a memory or to manipulate a read access. Also a stored program code may be attacked, since a disturbed program process could reveal secret information. To avoid this, a memory has to be protected against a manipulation of the read access and a change of data bits. At least such an attack has to be identified, so that for example an integrated circuit can react adequately with a restart or deactivation.

For this purpose are used frequently codes which can identify and/or correct an error. Such codes on the other hand need memory space for redundant data bits. For a considerable protection the relation of redundant bits and usable bits must be very high which results in an excessive need of space on an integrated circuit. Such methods for detecting errors are normally only efficient when dealing with huge data blocks. But such huge data blocks need more read access on a memory thereby reducing the performance what is not acceptable in the case of program codes.

Another possibility is the use of a well diode as a light detector as described in the WO 2004/047172 A1. Such a well diode is usually present in an integrated circuit. But this can be only done if the well is not disturbed in regular use.

Further the US 2005/0036383 A1 discloses a memory matrix whereas inactive lines of the memory matrix are used as light sensors for detecting an attack. If a line is in regular use it can not serve as a light detector. Also this detection can be only done at different places and/or times than that which shall be surveyed.

Finally the article: "Techniques to enhance the resistance of pre-charged busses to differential power analysis", M. Alioto, M. Poli, S. Rocchi, V. Vignoli, 16$^{th}$ International Workshop on power and timing modelling, Optimization and Simulation, PATMOS 2006, Montpellier France, deals with methods of protection against SPA/DPA-attacks, namely a passive survey of an integrated circuit.

A read access on a memory is normally divided into two steps, a pre-conditioning of a memory matrix and a process of measuring. Often a data line is pre-charged onto a predetermined potential and then a change of voltage is monitored. According to the change of voltage a bit is interpreted as 0 (Zero) or 1 (One). Since the use of such a pre-charge is of fundamental importance for reading out data it is also of interest for attacks. A disturbance of the pre-charge may lead easily to erroneous read data.

With a pre-charge a predetermined voltage is applied to a data line. The foregoing logical status may affect the pre-charge. But in both possible cases the voltage is raising or falling monotone or it is in one case constant and in the other case raising or falling monotone.

SUMMARY OF THE INVENTION

It is an object of the invention to create a method for monitoring an integrated circuit such that a disturbance of read access during a pre-charge can be detected. Further a respective integrated circuit shall be proposed.

These problems are solved by a memory as described in claim 1 and with an integrated circuit as described in claim 6 respectively.

The core of the invention lies in the fact that a line in the circuit, which can be charged with a voltage in normal use, can be used as a sensor. Such lines are already present in regular integrated circuits. With such sensors numerous attacks can be detected since a manipulation of a memory content or a read access would affect these lines or the actual voltages.

Preferably a data line is connected within the memory matrix to source- or drain-areas of MOS-transistors. If a pre-charge is performed by applying a voltage between this source- or drain-areas and a below them situated substrate then an external disturbance by light will let collapse this voltage. Also capacitive disturbances and other attacks will lead to a collapse of voltage. Thereby the pre-charge is not any more monotone. This can easily be detected by a differentiation of the voltage on this line over the time. So it is possible to detect an attack by a differentiated monitoring of the pre-charge to detect a voltage peak in opposite direction to the pre-charge.

If for any reason a collapse of voltage can not be anticipated exactly it is still possible to use the method with an accordingly designed integrated circuit. In this case memory areas, which are temporarily not selected, are used as sensors for attacks. To do this the unselected areas are pre-charged permanently.

This can be done best if on the integrated circuit the monitoring of the pre-charge is combined with a permanent pre-charge of unselected memory areas.

Also it is possible to activate a sensor when the memory is inactive, since then the whole matrix can be used as an attack sensor during its inactive time period.

It is obvious that such a monitoring can be done with a simple electronic circuit in form of a differential amplifier used as a differentiator. It is only necessary to monitor one global or almost global line for monitoring almost the whole area of the memory or at least of the memory matrix.

Especially at SRAM-memories stored data may be influenced also permanently by the application of light. That means that single data bits could change their logical status. Since an application of light onto a cell can not be done practically without an effect on the access transistors the use of sensors in not selected memory areas and/or at inactive points in time is very advantageous since an attack is detected although a read access is possibly not affected.

It is to be seen that such methods can be applied to all kinds of integrated circuits. Especially the use with smartcard integrated circuits is preferable since they have to be checked and certified extensively by independent laboratories before they are allowed to be used in critical applications for example as bank account card. Since there are always new kinds of attacks the security standards are raised accordingly. In particular stored secret information and program codes can be protected much better against attacks since a number of attacks with data manipulation or a disturbance of a read access influences the data lines and hence is detectable.

BRIEF DESCRIPTION OF THE DRAWING

An embodiment is hereinafter described with reference to the according drawing. The only FIGURE shows a schematic view of an integrated circuit according to the invention.

DETAILED DESCRIPTION OF THE DRAWING

Figure 1:
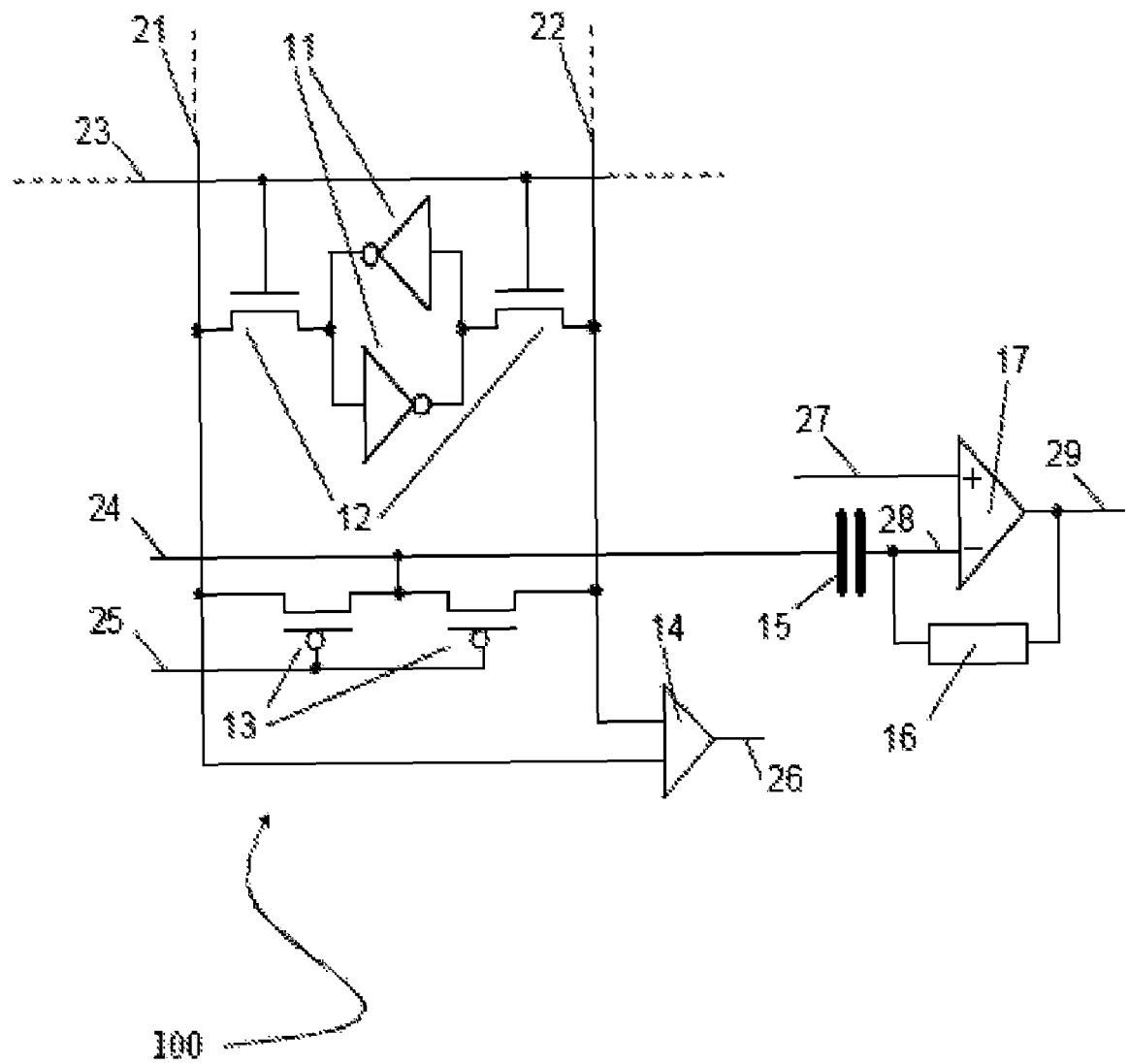

In FIG. 1 is depicted an exemplary electric integrated circuit (100) for protecting memories against attacks. This circuit consists of a SRAM-memory cell with two inverters (11) which are connected as a ring. Two nmos-access transistors (12) enable the reprogramming and the reading of the cell via data lines (21, 22) by connecting them via a line access control line (23) with the actual cell. To keep the drawing simple that parts of the circuit for programming are omitted.

Reading is performed with closed access transistors (12) by charging the data lines (21, 22) via pmos-pre-charge transistors (13) onto a predetermined potential. After the pre-charge the pre-charge transistors (13) are closed and the access transistors (12) are opened. A read amplifier (14) determines which of the two data lines (21, 22) looses first its potential and gives out the binary information at a data output (26).

With the aid of a differential amplifier (17) circuited with a capacitor (15) and a resistor (16) as a differentiator a collapse of voltage of a pre-charge supply-line (24) can be detected easily. An output of the differential amplifier (17) is levelled to the voltage at a positive input (27). A collapse of voltage with sufficient edge steepness on the pre-charge supply line (24) is passed with a capacitor to a negative input (28) of the differential amplifier (17) and leads to a positive pulse or peak at a sensor output (29).

LIST OF REFERENCE SIGNS 11 inverter
12 access transistor
13 pre-charge transistor
14 read amplifier
15 capacitor
16 resistor
17 differential amplifier
21 negative data line
22 positive data line
23 line access control line
24 pre-charge supply line
25 pre-charge control line
26 data output
27 positive input
28 negative input
29 sensor output
100 integrated circuit including exemplary SRAM cell

The invention claimed is:

1. Method of controlling a pre-charge process of a data line in an integrated circuit, characterised in that, a rate of change of a voltage applied to the data line is monitored.

2. Method according to claim 1, characterised in that, a value of the applied voltage is differentiated.

3. Method according to claim 1, characterised in that, an unselected area of the integrated circuit is monitored.

4. Method according to claim 1, characterised in that, a permanent pre-charge is applied.

5. Method according to claim 1, characterised in that, an inactive memory is monitored.

6. Integrated circuit with a data line to which a pre-charge process is applicable, characterised in that, a rate of change of a voltage applied to the data line is monitorable.

7. Integrated circuit according to claim 6, characterised in that, a value of the applied voltage is differentiable.

8. Integrated circuit according to claim 6, characterised in that, an unselected area of the integrated circuit is monitorable.

9. Integrated circuit according to claim 6, characterised in that, a permanent pre-charge is applicable.

10. Integrated circuit according to claim 6, characterised in that, an inactive memory is monitorable.

* * * * *